United States Patent
Iizuka et al.

(10) Patent No.: US 8,120,051 B2
(45) Date of Patent: Feb. 21, 2012

(54) SEMICONDUCTOR LIGHT EMITTING ELEMENT

(75) Inventors: Kazuyuki Iizuka, Hitachi (JP);
Masahiro Watanabe, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 162 days.

(21) Appl. No.: 12/662,645

(22) Filed: Apr. 27, 2010

(65) Prior Publication Data

US 2010/0301362 A1 Dec. 2, 2010

(30) Foreign Application Priority Data

May 27, 2009 (JP) .................................. 2009-127434

(51) Int. Cl.
*H01L 29/22* (2006.01)
(52) U.S. Cl. ............................. 257/98; 257/91; 257/99
(58) Field of Classification Search .................... 257/98, 257/99, 91
See application file for complete search history.

(56) References Cited

U.S. PATENT DOCUMENTS

| | | | | |
|---|---|---|---|---|
| 5,917,202 A | * | 6/1999 | Haitz et al. | 257/98 |
| 6,222,207 B1 | * | 4/2001 | Carter-Coman et al. | 257/98 |
| 6,649,437 B1 | * | 11/2003 | Yang et al. | 438/30 |
| 6,784,462 B2 | * | 8/2004 | Schubert | 257/98 |
| 6,869,820 B2 | * | 3/2005 | Chen | 438/79 |
| 7,087,933 B2 | | 8/2006 | Takeda et al. | |
| 7,566,576 B2 | * | 7/2009 | Murofushi et al. | 438/29 |
| 7,687,818 B2 | * | 3/2010 | Yoon et al. | 257/98 |
| 7,714,343 B2 | * | 5/2010 | Unno et al. | 257/98 |
| 2001/0004534 A1 | * | 6/2001 | Carter-Coman et al. | 438/29 |

FOREIGN PATENT DOCUMENTS

JP  2005-175462  6/2005

* cited by examiner

*Primary Examiner* — Eugene Lee
(74) *Attorney, Agent, or Firm* — McGinn IP Law Group, PLLC

(57) ABSTRACT

A semiconductor light emitting element includes a group III-V compound semiconductor layer, a first main surface and a second main surface, a reflection metal film formed on the second main surface, a front surface electrode formed on the first main surface, and an ohmic contact joint part formed between the reflection metal film and the group III-V compound semiconductor layer except a region directly under the front surface electrode. The ohmic contact joint part is disposed in a side of an outer peripheral part of the semiconductor light emitting element, formed so as to surround the front surface electrode when the ohmic contact joint part is viewed from a side of the front surface electrode, and disposed so that distance from each location of outer edge parts of the front surface electrode to the ohmic contact joint part nearest to the each location becomes equal to each other.

8 Claims, 15 Drawing Sheets

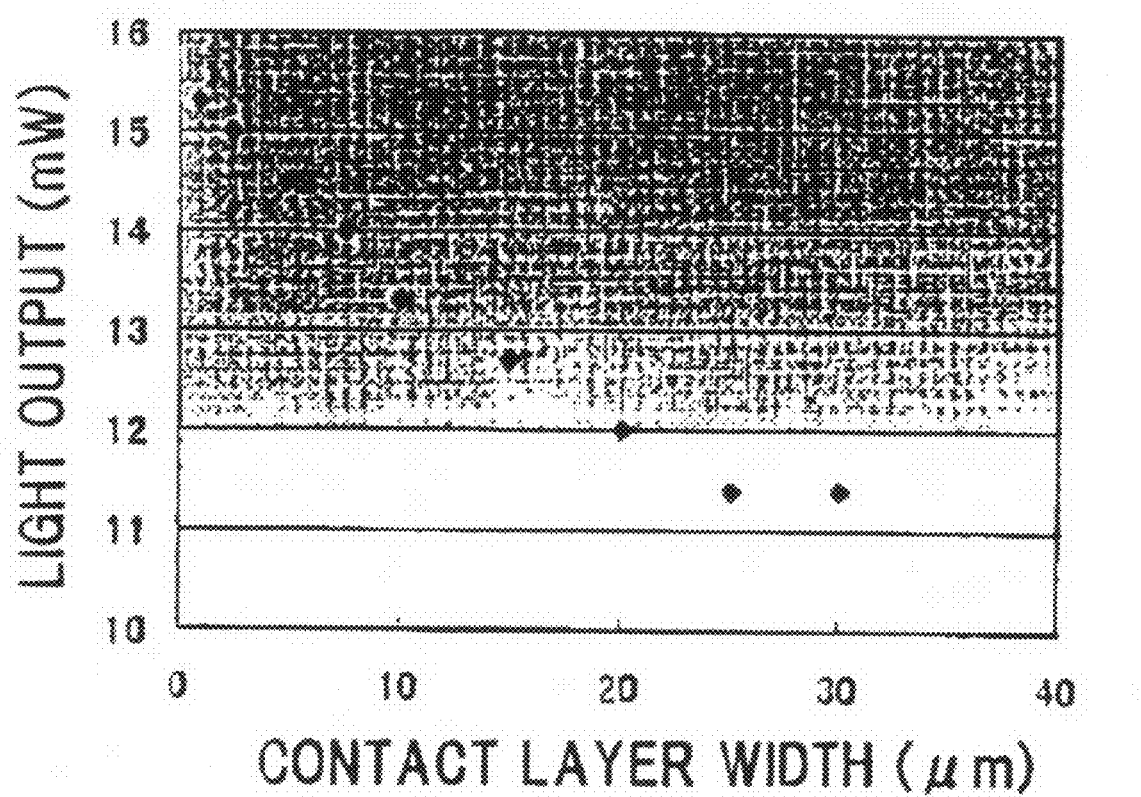

SEMICONDUCTOR LIGHT EMITTING ELEMENT

The present application is based on Japanese patent application No. 2009-127434 filed on May 27, 2009, the entire contents of which are incorporated herein by reference.

BACKGROUND OF THE INVENTION

1. Field of the Invention

This invention relates to a semiconductor light emitting element that is structured such that an ohmic contact joint part and a reflection metal film are sandwiched between a group III-V compound semiconductor layer including a light emitting layer and a support substrate. In particular, this invention relates to a semiconductor light emitting element with improved light extraction efficiency.

2. Description of the Related Art

Recently, for light emitting diodes (LEDs) as a semiconductor light emitting element, GaN or AlGaInP-based high quality crystals can be grown by metal-organic vapor phase epitaxy (MOVPE), so as to produce high brightness blue, green, orange, yellow and red LEDs. Along with the development of the high brightness LEDs, its use has been expanded to a brake lamp of automobile, a backlight of liquid crystal display and the like, and its demand has been increased year by year.

At present, since high quality crystals can be grown by MOVPE, the internal efficiency of the light emitting element comes close to the theoretical value or the limit value. However, the light extraction efficiency of the light emitting element is still low, so that it is more important to improve the light extraction efficiency. For example, a high brightness red LED is formed of an AlGaInP based material, and the light emitting part thereof forms a double-hetero structure that has an n-type AlGaInP layer and a p-type AlGaInP layer of an AlGaInP based material with a composition lattice-matching on a conductive GaAs substrate, and a light emitting layer (or an active layer) of AlGaInP or GaInP and sandwiched between the n-type AlGaInP layer and the p-type AlGaInP. However, since the bandgap of the GaAs substrate is narrower than that of the light emitting layer, most of light emitted from the light emitting layer is absorbed by the GaAs substrate such that the light extraction efficiency is significantly reduced.

For reducing the light absorption by the GaAs substrate, the following methods are used. A method is known that the light absorption by the GaAs substrate can be reduced by forming a multilayer reflection film structure with semiconductor layers different in refractive index between a light emitting layer to enhance the light extraction efficiency. However, in this method, only light with a restricted incident angle to the multilayer reflection film structure can be reflected.

Further, a method is proposed that a double-hetero structure of an AlGaInP based material is bonded to a Si support substrate with a thermal conductivity higher than the GaAs substrate via a reflection metal film with high reflectivity, and the GaAs substrate used for growth of semiconductor is then removed. This technique is disclosed in, for example, JP-2005-175462 A1. By the reflection metal film used for this method, high reflectivity can be brought regardless of any incident angle of light to the reflection metal film, so that high brightness LED can be obtained.

In the above LED structure that the reflection metal film is sandwiched between the light emitting layer and the Si support substrate, when a high reflectivity metal such as Al, Au, Ag is used for the reflection metal film, it is impossible to have electrically ohmic contact with the compound semiconductor. Therefore, a part of the reflection metal film is replaced by ohmic contact joint part. Thus, electron or hole injected into the LED element moves through a front surface electrode formed on the light emitting part and the ohmic contact joint part to the Si support substrate. At the time, light is emitted from the active layer located between the front surface electrode and the ohmic contact joint part. The emitted light is extracted through a surface (i.e., a light extraction surface) of the semiconductor layer on the light emitting part outside the light emitting element.

In the LED structure that the ohmic contact joint part and the reflection metal film is sandwiched between the light emitting layer and the Si support substrate, a part of light emitted is multiply reflected between the light extraction surface and the reflection metal film. If the reflected light reaches the ohmic contact joint part or the front surface electrode, the ohmic contact joint part and the front surface electrode highly absorb the emitted light, so that the light cannot be extracted outside. Particularly, the front surface electrode has an area larger than the ohmic contact joint part such that it can be a big absorption factor relative to the whole light emitting element. Thus, the area of the front surface electrode needs to be reduced. However, the front surface electrode having a simple circular shape etc. may cause a further deterioration in current spreading property if the area of the front surface electrode is reduced.

In order to uniformly spread current in the light emitting element, various shapes of the front surface electrode are devised, for example, linear electrodes being extended from the center of a circular portion (e.g., as shown in FIG. 10), so as to attain not only the enhancement of the light extraction efficiency but also the reduction of forward voltage.

SUMMARY OF THE INVENTION

Therefore, it is an object of the invention to provide a semiconductor light emitting element that is capable of enhancing the light extraction efficiency.

(1) According to one embodiment of the invention, a semiconductor light emitting element comprises:

a group III-V compound semiconductor layer comprising a light emitting layer, a first main surface comprising a light extraction surface formed thereon, and a second main surface;

a reflection metal film formed on the second main surface for reflecting a light emitted from the light emitting layer toward the light extraction surface;

a support substrate joined to the group III-V compound semiconductor layer via the reflection metal film;

a front surface electrode formed on the first main surface;

an ohmic contact joint part formed between the reflection metal film and the group III-V compound semiconductor layer except a region directly under the front surface electrode; and a front surface side contact part and a transparent dielectric reflection part formed between the group III-V compound semiconductor layer and the front surface electrode, wherein the semiconductor light emitting element further comprises a quadrangular shape of not more than 320 μm on a side, wherein the front surface electrode comprises a polygonal shape or a circular shape and an outer peripheral length of not less than 235 μm and not more than 700 μm, and wherein the ohmic contact joint part is disposed in a side of an outer peripheral part of the semiconductor light emitting element, formed so as to surround the front surface electrode when the ohmic contact joint part is viewed from a side of the front surface electrode, and disposed so that distance from each location of outer edge parts of the front surface electrode to the ohmic contact joint part nearest to the each location becomes equal to each other.

In the above embodiment (1), the following modifications and changes can be made.

(i) The semiconductor light emitting element further comprising:
a transparent dielectric film formed between the group III-V compound semiconductor layer and the reflection metal film,
wherein the ohmic contact joint part is formed in a part of the transparent dielectric film so as to pass through the transparent dielectric film.

(ii) The front surface side contact part is formed in a region whose outer peripheral length is not less than 5 μm and not more than 30 μm, and the transparent dielectric reflection part is formed inside the front surface side contact part.

(iii) The transparent dielectric reflection part comprises $SiO_2$, SiN or ITO.

(iv) The transparent dielectric reflection part has a refractive index of not more than 2.3.

(v) The light extraction surface comprises a concavo-convex shape of not less than 100 nm in height.

(vi) The ohmic contact joint part comprises a strip portion that is shaped similarly to the polygonal shape or the round shape of the front surface electrode, and is arranged concentrically with the front surface electrode in top view.

(vii) The light extraction surface is covered with a transparent film.

Points of the Invention

According to one embodiment of the invention, a front surface electrode is formed so as to have a small and compact shape such as a simple polygonal shape or round shape, and an ohmic contact joint part is disposed in a side of outer periphery of a light emitting element so as to surround the front surface electrode when the ohmic contact joint part is viewed from a side of the front surface electrode and to be away from the front surface electrode as much as possible. Depending on the distance (particularly, the horizontal distance between the ohmic contact joint part and the front surface electrode when the ohmic contact joint part is viewed from a side of the front surface electrode) between the ohmic contact joint part and the front surface electrode, the light extraction efficiency is widely varied, and the larger the distance is, the higher the light output is. When the front surface electrode becomes large, the above-mentioned distance inevitably becomes small, so that the light output is also lowered.

BRIEF DESCRIPTION OF THE DRAWINGS

The preferred embodiments according to the invention will be explained below referring to the drawings, wherein:

FIG. 11 is a graph schematically showing a relationship between a width of a front surface side contact part and a light output in a structure of Example 1;

DETAILED DESCRIPTION OF THE PREFERRED EMBODIMENTS

Figure 1:
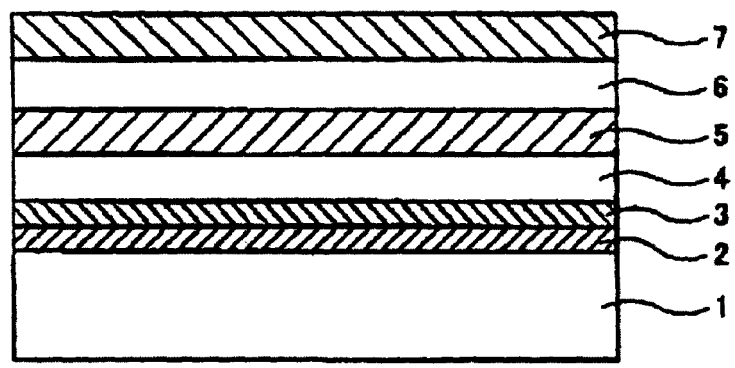
FIG. 1 is a cross-sectional view schematically showing a process of a method of manufacturing a semiconductor light emitting element according to Example 1 of the invention.

The preferred embodiments according to the invention will be explained below referring to the drawings.

The inventors of the present invention have found that, in a light emitting element having a current constricting structure that an ohmic contact joint part is disposed in a region except directly below the front surface electrode so as to reduce light absorption by the front surface electrode, especially when the light emitting element has a small chip size, the front surface electrode having such a complex shape that it extends linearly causes an increase in area of the front surface electrode to lower the light extraction efficiency. The present invention has been made based on the above findings.

A semiconductor light emitting element according to the present embodiment includes a group III-V compound semiconductor layer that has a light emitting layer, a first main surface on which a light extraction surface is formed and a second main surface, a reflection metal film formed on the second main surface for reflecting a light emitted from the light emitting layer toward the light extraction surface side and a support substrate joined to the group III-V compound semiconductor layer via the reflection metal film. A rear surface electrode is formed on the support substrate.

It is preferable that the reflection metal film, at least a part of the reflection metal film located at a side of the second main surface, is formed of a metal having a reflectivity of not less than 80% to an emission wavelength such as at least any of Au, Ag, Al, and their alloys. It is preferable that the light extraction surface has a concavo-convex shape of not less than 100 nm in height of the surface (maximum height of surface roughness) in order to enhance the light extraction efficiency.

In addition, the semiconductor light emitting element according to the present embodiment includes a front surface electrode formed on the first main surface; and an ohmic contact joint part for reducing contact resistance disposed on a part of the surface of the reflection metal film located in a side of the group III-V compound semiconductor layer that is a region other than a place located directly below the front surface electrode. Namely, the ohmic contact joint part and the front surface electrode form an electric current constricting structure that they are arranged so as not to be overlapped to each other as viewed from a side of the light extraction surface.

In the present embodiment, a transparent dielectric film formed of a transparent material to a light emitted from the emitting layer is formed between the group III-V compound semiconductor layer and the reflection metal film, and the ohmic contact joint part is formed in a part of the transparent dielectric film so as to pass through the transparent dielectric film. It is preferable that a film thickness of the transparent dielectric film is not less than $(2 \times \lambda)/(4 \times n)$, if an emission wavelength is defined as $\lambda$ and a refractive index of the transparent dielectric film is defined as n. In addition, it is preferable to use, for example, $SiO_2$, SiN as a material of the transparent dielectric film.

Figure 8:
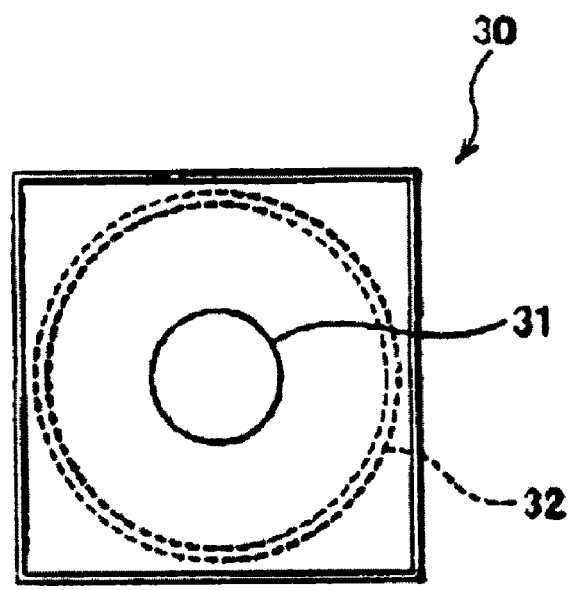
FIG. 8 is a top view schematically showing a semiconductor light emitting element including a front surface electrode having a circular shape.
Figure 9:
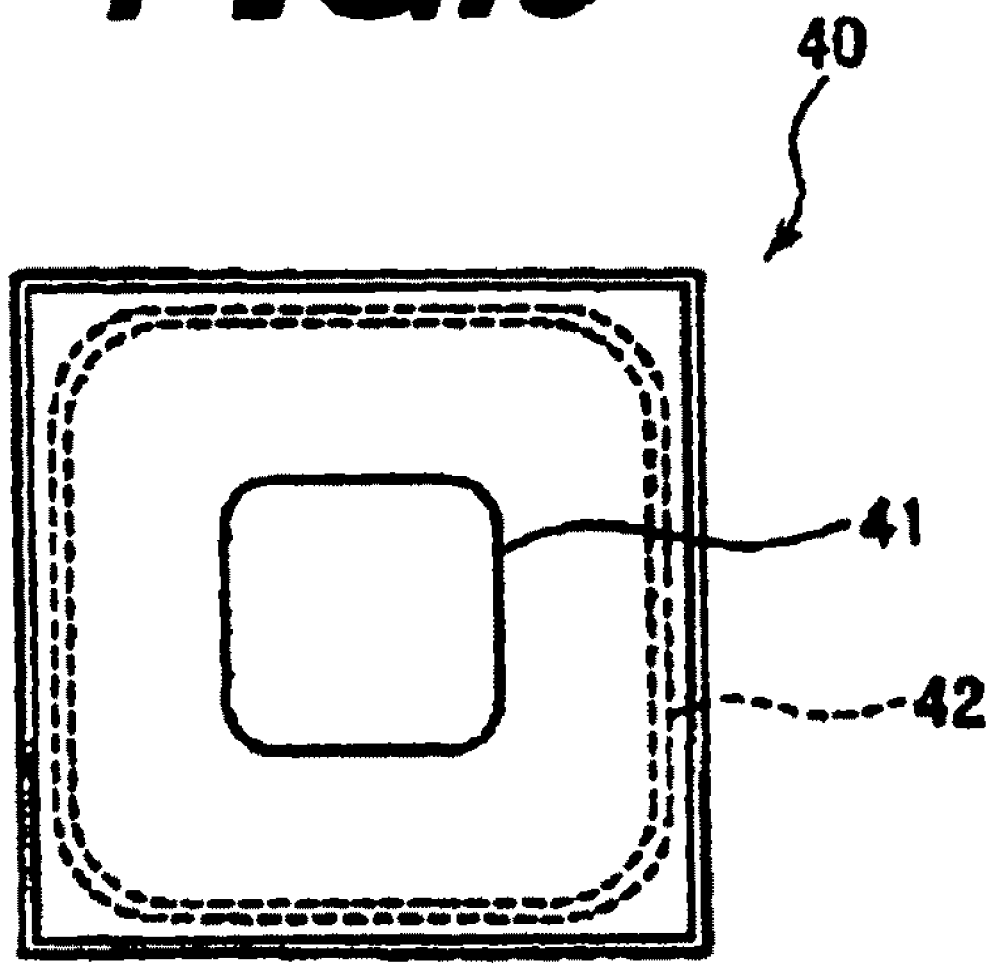
FIG. 9 is a top view schematically showing a semiconductor light emitting element including a front surface electrode having a quadrangular shape whose corner parts are chamfered.
Figure 10A:
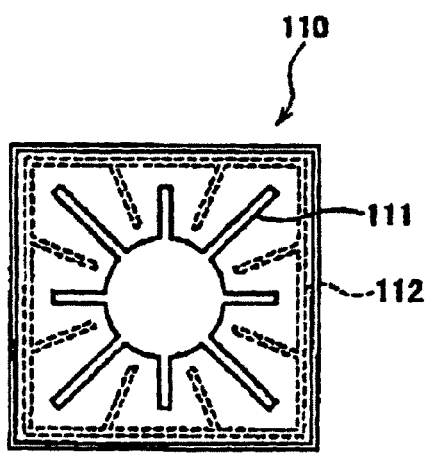
FIG. 10 is a top view schematically showing a conventional semiconductor light emitting element having a large chip size.
Figure 10B:
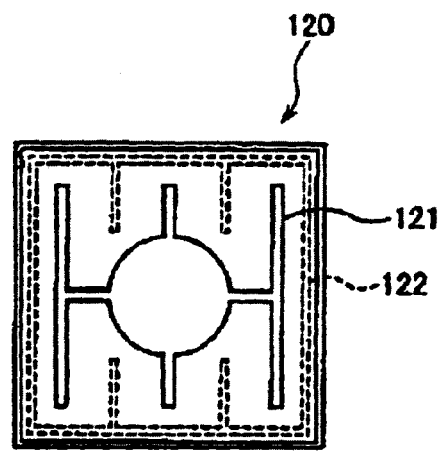

The semiconductor light emitting element has a chip size of a quadrangular shape of not more than 320 μm on a side and the front surface electrode has a polygonal shape such as a quadrangular shape, a pentagonal shape or a round shape such as a circular shape, an elliptical shape. Namely, the front surface electrode of the present embodiment does not have a complex shape that extends or protrudes from a center portion (to be a part for forming an electrode pad) of a circular shape or the like in a linear fashion (for example, the front surface electrodes 111, 121 shown in FIG. 10), but has a simple round shape (for example, the front surface electrode 31 of a circular shape shown in FIG. 8) or a simple polygonal shape (for example, the front surface electrode 41 of a quadrangular shape shown in FIG. 9). In other words, the front surface electrode has a shape that does not have a part extending in a linear fashion but is formed compactly. The front surface electrode has an outer peripheral length of not less than 235 μm and not more than 700 μm. Further, a similar effect can be also obtained in case that the front surface electrode has a quadrangular shape whose corner parts are smoothly chamfered by a curved surface or a straight line, for example, as the front surface electrode 41 shown in FIG. 9. Furthermore, generally, the electrode pad that has the same shape and size as the front surface electrode is formed on the front surface electrode.

Figure 7A:
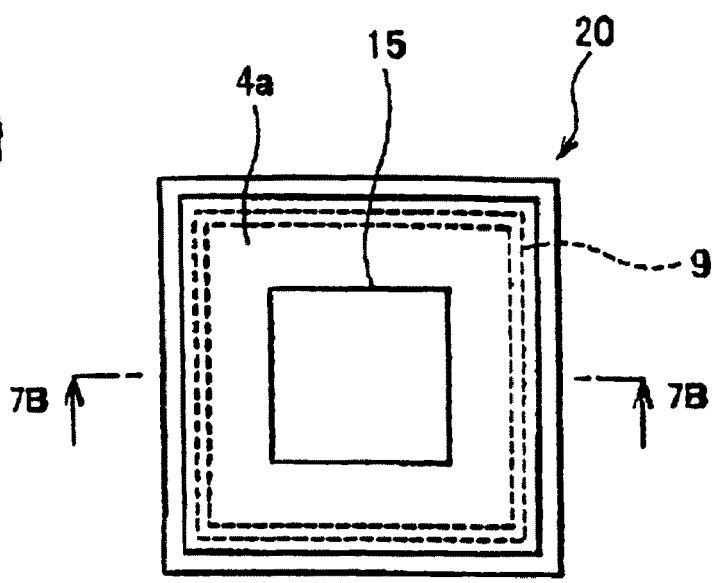
FIG. 7A is a top view schematically showing a process of a method of manufacturing a semiconductor light emitting element of Example 1 according to the invention.
Figure 7B:
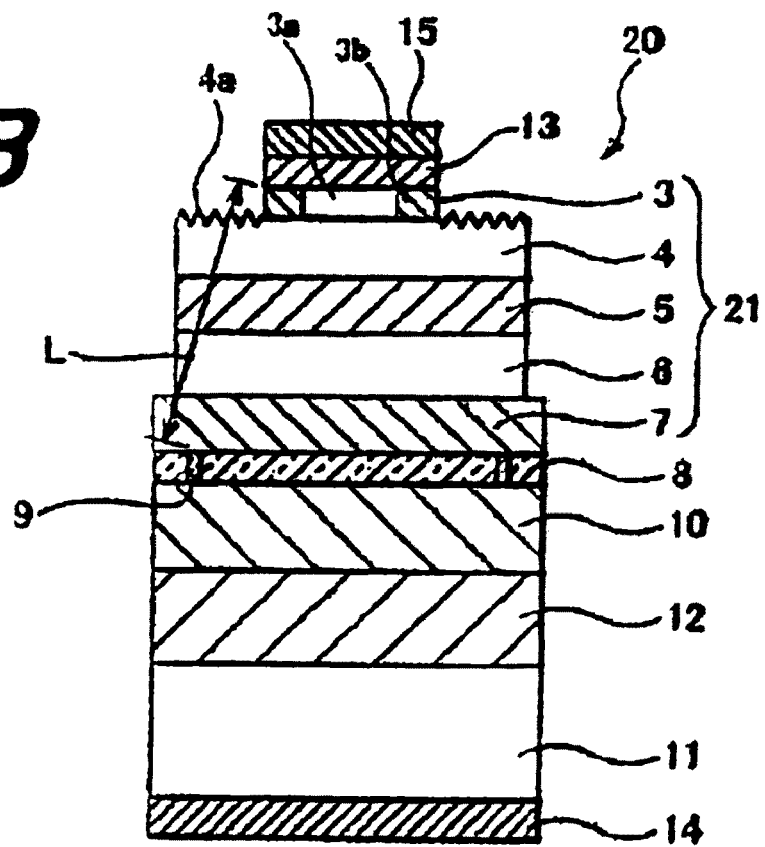
FIG. 7B is a cross-sectional view taken along the line 7B-7B in FIG. 2A.

The ohmic contact joint part is disposed in a side of an outer peripheral part of the semiconductor light emitting element, and it is formed in a linear fashion or the like so as to surround the front surface electrode when the ohmic contact joint part is viewed from a side of the front surface electrode and further it is disposed so that distance (for example, refer to distance (shortest distance) L shown in FIG. 7B) from each location of outer edge parts of the front surface electrode to the ohmic contact joint part nearest to the each location becomes equal to each other.

Particularly, the front surface electrode is formed in the central part of the first main surface of the group III-V compound semiconductor layer so as to have a polygonal shape such as a square shape or a round shape such as a circular shape, and the ohmic contact joint part is formed so as to surround the front surface electrode when the ohmic contact joint part is viewed from a side of the front surface electrode and have a polygonal shape or a round shape in a linear fashion or the like in a concentric arrangement that is a similarity shape to the polygonal shape or the round shape of the front surface electrode.

Further, the ohmic contact joint part is not limited to have a single and closed shape such as the polygonal shape or the round shape in a linear fashion, but it can have a shape that is arranged in a polygonal shape or a round shape as a whole formed by that a plurality of linear segments or the like surround the front surface electrode, if the ohmic contact joint part is formed so as to surround the front surface electrode when the ohmic contact joint part is viewed from a side of the front surface electrode. Or, the ohmic contact joint part can be formed so as not to surround all the outer periphery of the front surface electrode, for example, the front surface electrode of a quadrangular shape is disposed adjacent to a side of the light emitting element chip instead of the central part of the light emitting element chip, and the ohmic contact joint part can be formed so as to surround three sides of the front surface electrode of a quadrangular shape in a U-shape.

In addition, the ohmic contact joint part is disposed so that distance from each location of outer edge parts of the front surface electrode to the ohmic contact joint part nearest to the each location becomes equal to each other, but not limited to this, it can be disposed so that there are partially some positional relation where the distance is not equal to each other.

When forward voltage is applied to the light emitting element, electric current flows from the front surface electrode to the support substrate through the ohmic contact joint part. At that time, light can be emitted from the light emitting layer between the front surface electrode and the ohmic contact joint part. The emitted light is extracted through the light extraction surface, a side surface of the group III-V compound semiconductor layer or the like outside the light emitting element.

In case that the light emitting element has a large chip size, the front surface electrode having a complex shape that extends from the central part of a circular shape or the like in a linear fashion has a good electric current dispersibility, in addition, amounts of light absorption and light shielding thereof are not so large, so that the front surface electrode can has an excellent front surface electrode shape. However, recently, a light emitting element having a small chip size is fabricated, consequently, in case that the chip size is smaller than 320 μm on a side, and the front surface electrode has a complex shape that has a part extending in a linear fashion, an occupation ratio of an area of the front surface electrode to an area of an upper surface of the light emitting element chip is increased, so that the increase of amount of light absorption becomes more problematic than enhancement of electric current dispersibility and the light extraction efficiency is lowered.

Consequently, in the present embodiment, the front surface electrode is formed so as to have a small and compact shape such as a simple polygonal shape or round shape, in addition, the ohmic contact joint part is disposed in a side of outer periphery of the light emitting element so as to surround the front surface electrode when the ohmic contact joint part is viewed from a side of the front surface electrode and to get away from the front surface electrode as much as possible.

This is due to the fact that in accordance with distance between the ohmic contact joint part and the front surface electrode (particularly, horizontal distance between the ohmic contact joint part and the front surface electrode when the ohmic contact joint part is viewed from a side of the front surface electrode), the light extraction efficiency is widely varied, and the larger the distance is, the higher the light output is. When the front surface electrode becomes large, the above-mentioned distance inevitably becomes small, so that the light output is also lowered.

The front surface electrode (or the electrode pad) is required to have a length (dimension) of not less than 75 μm, as a length being traversed by a straight line passing the center of the front surface electrode in order to allow a wire bonding at the excellent yield. A shape of the front surface electrode (or the electrode pad) by which the minimum length of 75 μm can be ensured and the outer peripheral length can be also shortened is a circular shape of 75 μm in diameter, and the outer peripheral length of the circular shape of 75 μm in diameter is 235 μm. Consequently, it is preferable that the outer peripheral length of front surface electrode is not less than 235 μm.

Figure 15:
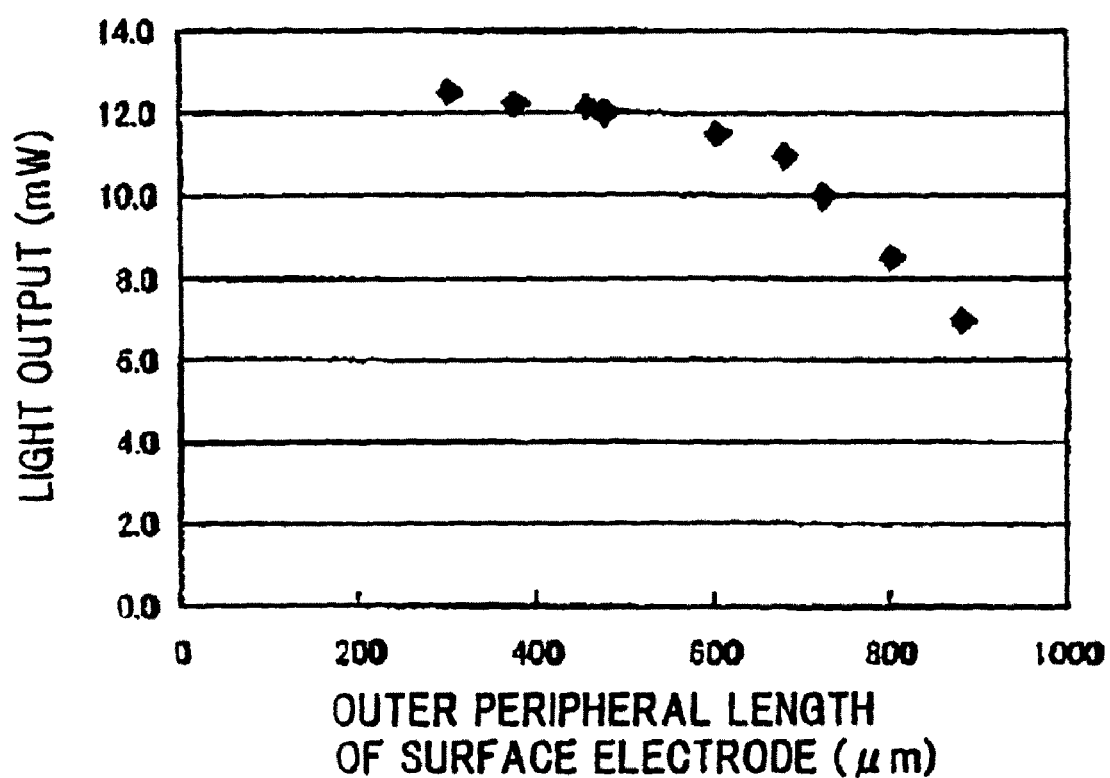
FIG. 15 is a graph schematically showing a relationship between an outer peripheral length of a front surface side contact part and a light output in a structure of a semiconductor light emitting element including a front surface electrode having a quadrangular shape.
Figure 16:
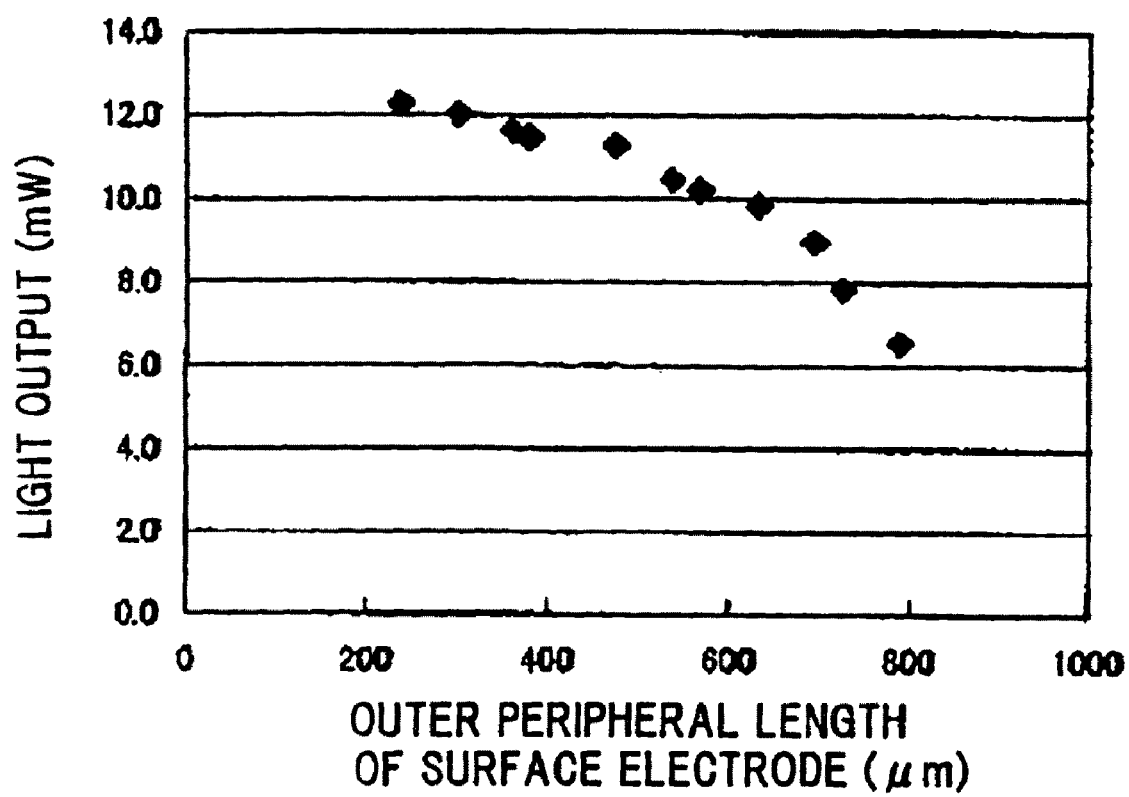
FIG. 16 is a graph schematically showing a relationship between an outer peripheral length of a front surface side contact part and a light output in a structure of a semiconductor light emitting element including a front surface electrode having a circular shape.

On the other hand, in case that a chip size on a side of the light emitting element is less than 320 μm, when an outer peripheral length of the front surface electrode of a simple round or polygonal shape becomes longer than 700 μm, the light extraction efficiency is lowered due to the light absorption of the front surface electrode and the light output is drastically lowered. FIG. 15 is a graph schematically showing a relationship between an outer peripheral length of a front surface side contact part and a light output in a structure of a semiconductor light emitting element including a front surface electrode having a quadrangular shape, and FIG. 16 is a graph schematically showing a relationship between an outer peripheral length of a front surface side contact part and a light output in a structure of a semiconductor light emitting element including a front surface electrode having a circular shape. Further, the light emitting element has an element shape shown in FIG. 13, and it is not configured to have a transparent dielectric reflection part described below between the front surface electrode and the group III-V compound semiconductor layer.

As described above, it is preferable that the outer peripheral length of the front surface electrode having a small chip size is set to not more than 700 μm. In addition, accuracy is required in the bonding process, but by being formed so as to be not more than 480 μm, the light output can be further enhanced.

In case that a chip size on a side of the light emitting element is more than 320 μm, the front surface electrode (electrode pad) is formed so as to have a shape having a part that extends from the front surface electrode of a simple round or quadrangular shape in a linear fashion and electric current is dispersed and spread into the chip, so that the light output is enhanced. In reverse, it is supposed that in case of a relatively small chip whose size on a side is not more than 320 μm, if the linear electrode is extended from the front surface electrode (the electrode pad) of a simple round or polygonal shape, a factor of light absorption acts more strongly than the effect that electric current is dispersed and spread into the whole of the chip, so that the light output cannot be increased.

Due to the above-mentioned reason, the chip size is defined in the embodiment, and further a transparent dielectric reflection part is formed by replacing a part of n-type contact layer formed on the group III-V compound semiconductor layer having the light emitting layer with the transparent dielectric reflection part in order to prevent the light absorption at the n-type contact layer formed under the front surface electrode.

Particularly, the transparent dielectric reflection part formed of a transparent dielectric material having a of not more than 2.3 is formed on the group III-V compound semiconductor layer, a front surface side contact part for being brought into an ohmic contact with the group III-V compound semiconductor layer is formed around the transparent dielectric reflection part. And, a front surface electrode is formed on the transparent dielectric reflection part and the front surface side contact part.

By forming the transparent dielectric reflection part having a low refractive index as a part between the group III-V compound semiconductor layer and the front surface electrode, even if a light emitted from the light emitting layer enters into a region of the front surface electrode, a part of the light having entered can be reflected at a place between the group III-V compound semiconductor layer and the transparent dielectric reflection part. Also, by forming the front surface electrode of a metal having a high reflectivity, the light having transmitted through the transparent dielectric reflection part can be reflected at the front surface electrode.

Due to this, the light having entered into a region of the front surface electrode can be prevented from being absorbed, and can be reflected to a side of the reflection metal film, so that an amount of the light to be extracted from the semiconductor light emitting element can be further increased. Further, a material of the front surface electrode includes Al, Ag and Au.

EXAMPLES

Hereinafter, Example(s) of the present invention will be explained.

Example 1

FIGS. 7A and 7B schematically show a semiconductor light emitting element of Example 1 according to the invention. FIGS. 1 to 6 are cross-sectional views schematically showing each process of a method of manufacturing a semiconductor light emitting element according to Example 1 of the invention. Further, in order to simplify the drawings, FIGS. 1 to 6 show situations that two light emitting elements 20 are manufactured in the condition of being arranged side by side.

First, an epitaxial wafer for a red LED having a structure shown in FIG. 1 and having a light emitting wavelength at or near 630 nm was manufactured. An epitaxial growth method, an epitaxial structure, a electrode forming method and an LED element manufacturing method are as follows.

In the epitaxial growth, an undoped $(Al_{0.7}G_{4.3})_{0.5}In_{0.5}P$ etching stop layer 2, an n-type (Si-doped) GaAs contact layer 3, an n-type (Si-doped) $(Al_{0.7}Ga_{0.3})_{0.5}In_{0.5}P$ clad layer 4, an undoped $(Al_{0.1}Ga_{0.9})_{0.5}In_{0.5}P$ active layer (light emitting layer) 5, a p-type (Mg-doped) $(Al_{0.7}Ga_{0.3})_{0.5}In_{0.5}P$ clad layer 6 and a p-type (Mg-doped) GaP contact layer are sequentially stacked and grown on an n-type GaAs substrate 1 by using a MOVPE method.

The MOVPE growth was carried out under the conditions of growth temperature of 650 degrees C., growth pressure of 50 Torr (about 6666 Pa), growth speed of each layer of 0.3 to 1.0 nm/sec and V/III ratio of about 200. Further, the above-mentioned V/III ratio means a ratio (quotient) of the number of moles of V group material such as $AsH_3$, $PH_3$ to the number of moles of III group material such as TMGa, TMAl.

As materials for the MOVPE growth, for example, an organic metal such as trimethylgallium (TMGa), trimethylaluminum (TMAl), trimethylindium (TMIn) and a hydride gas such as arsine ($AsH_3$), phosphine ($PH_3$) were used. As an additive material of conductivity type determining impurity of n-type semiconductor layer, disilane ($Si_2H_6$) was used. Also, as an additive material of conductivity type determining impurity of p-type semiconductor layer, biscyclopentadienylmagnesium ($Cp_2Mg$) was used.

In addition, as the additive material of conductivity type determining impurity of n-type semiconductor layer, hydrogen selenide ($H_2Se$), monosilane ($SiH_4$), diethyltellurium (DETe), dimethyltellurium (DMTe) can be also used. Also, as the additive material of conductivity type determining impurity of p-type semiconductor layer, dimethylzinc (DMZn), diethylzinc (DEZn) can be also used.

Figure 2A:
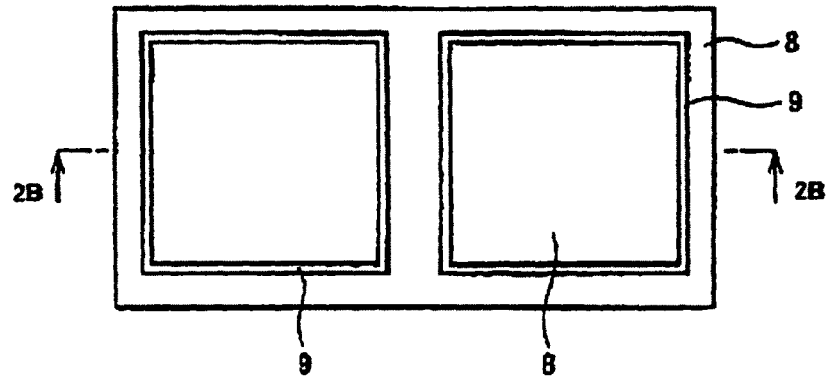
FIG. 2A is a top view schematically showing a process of a method of manufacturing a semiconductor light emitting element according to Example 1 of the invention.
Figure 2B:
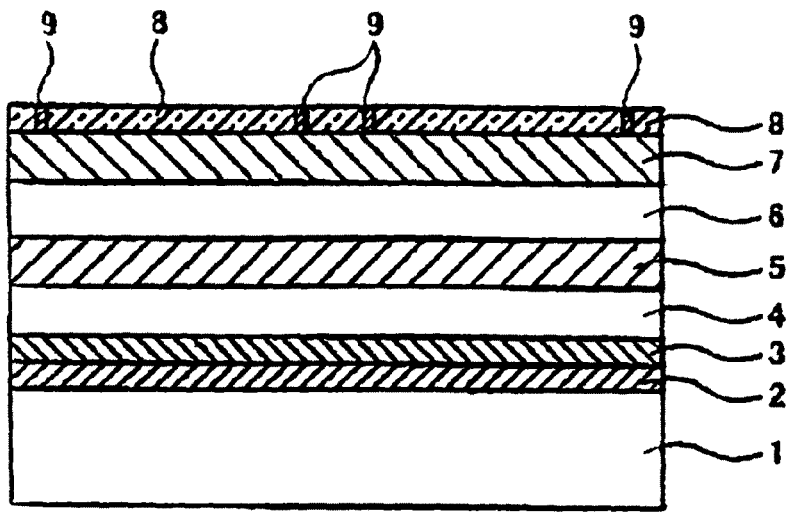
FIG. 2B is a cross-sectional view taken along the line 2B-2B in FIG. 2A.

Further, as shown in FIGS. 2A, 2B, after the epitaxial wafer for a red LED was carried out of the MOVPE device, a $SiO_2$ film 8 as the transparent dielectric film was formed on a surface of the p-type GaP contact layer 7 by a plasma CVD device, an opening part of a square shape in a linear fashion was formed in the $SiO_2$ film 8 by a hydrofluoric acid based etching liquid by using a general photography technique such as a resist, a mask aligner, and an ohmic contact joint part 9 of a square shape in a linear fashion was formed in the opening part by a vacuum deposition method. FIG. 2A is a top view schematically showing a process of a method of manufacturing a semiconductor light emitting element according to Example 1 of the invention, and FIG. 2B is a cross-sectional view taken along the line 2B-2B in FIG. 2A. As the ohmic contact joint part 9, a AuZn (gold-zinc) alloy was used. In addition, the ohmic contact joint part 9 was arranged so as to be located in a region other than a place located directly below a front surface electrode that is formed later.

Figure 3:
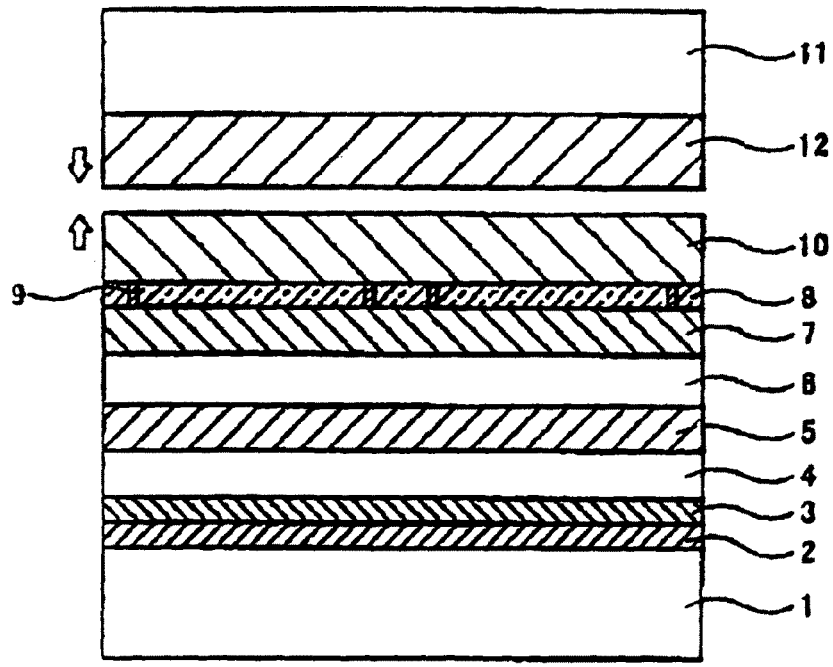
FIG. 3 is a cross-sectional view schematically showing a process of a method of manufacturing a semiconductor light emitting element according to Example 1 of the invention.

Next, as shown in FIG. 3, an Al (aluminum) layer, a Ti (titanium) layer, a Au (gold) layer as the reflection metal film 10 were respectively deposited on the above-mentioned epitaxial wafer for LED with ohmic contact joint part sequentially. The Al layer becomes a reflection layer (a reflection film), the Ti layer becomes a diffusion preventing barrier layer and the Au layer becomes a junction layer.

On the other hand, as shown in FIG. 3, a Ti (titanium) layer, a Pt (platinum) layer and a Au layer were respectively deposited on a surface of the Si substrate 11 prepared as a support substrate sequentially, so as to form a metal adhesion layer 12. The Ti layer becomes an ohmic contact metal layer, the Pt layer becomes a diffusion preventing barrier layer and the Au layer becomes a junction layer.

As shown in FIG. 3, the Au junction layer on a surface of the epitaxial wafer for LED manufactured as described above and the Au junction layer on a surface of the Si substrate 11 were laminated. The lamination was carried out under the conditions of an atmosphere of pressure of 0.01 Torr (about 1.33 Pa), loading of 30 Kgf/$cm^2$, temperature of 350 degrees C. and retention time of 30 minutes.

Figure 4:
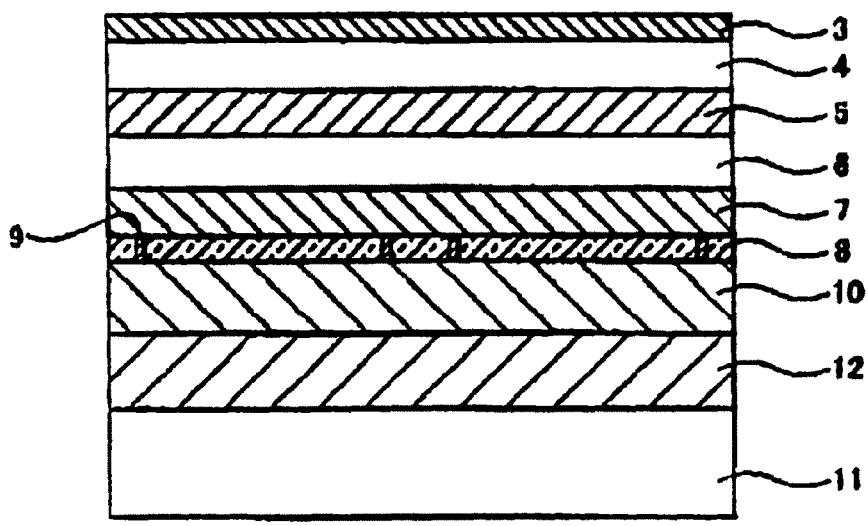
FIG. 4 is a cross-sectional view schematically showing a process of a method of manufacturing a semiconductor light emitting element according to Example 1 of the invention.

Next, as shown in FIG. 4, the GaAs substrate 1 of the epitaxial wafer for LED laminated to the Si substrate 11 was removed by an etching process where a mixed liquid of ammonia water and hydrogen peroxide solution was used as an etchant, so that the undoped $(Al_{0.7}Ga_{0.3})_{0.5}In_{0.5}P$ etching stop layer 2 was exposed. Also, the etching stop layer 2 was removed by hydrochloric acid, so that the n-type GaAs contact layer 3 was exposed.

Figure 5A:
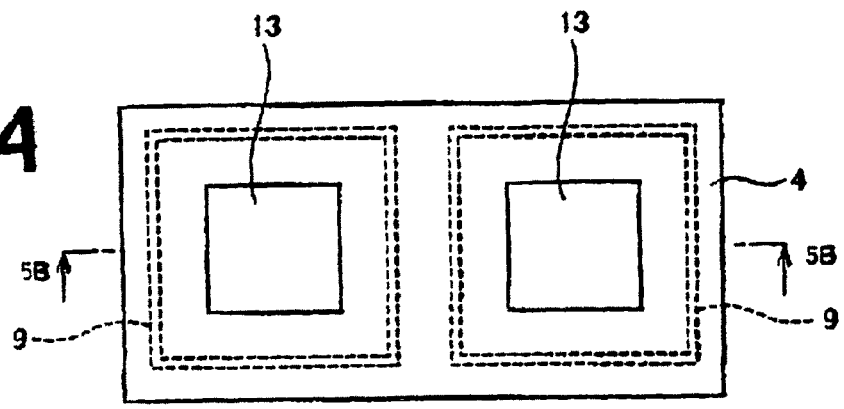
FIG. 5A is a top view schematically showing a process of a method of manufacturing a semiconductor light emitting element according to Example 1 of the invention.
Figure 5B:
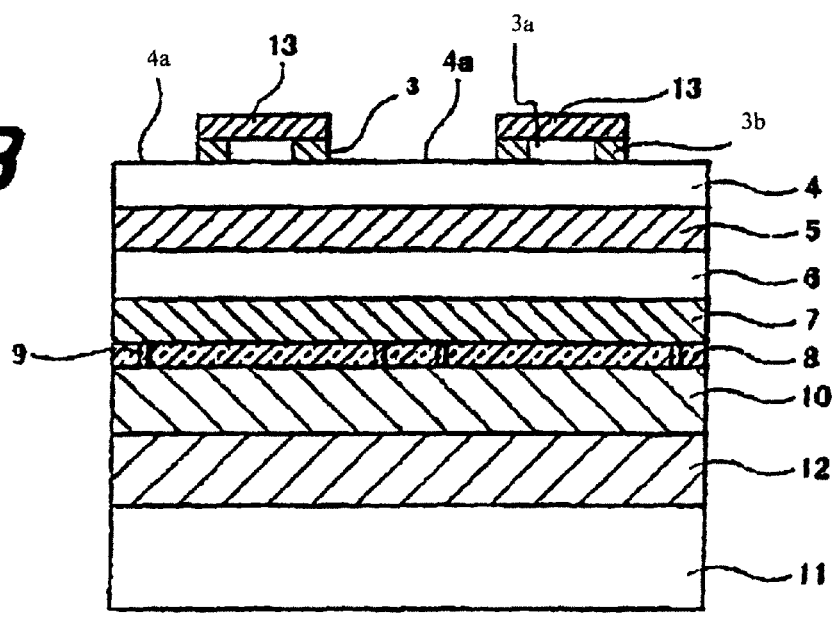
FIG. 5B is a cross-sectional view taken along the line 5B-5B in FIG. 2A.
Figure 6A:
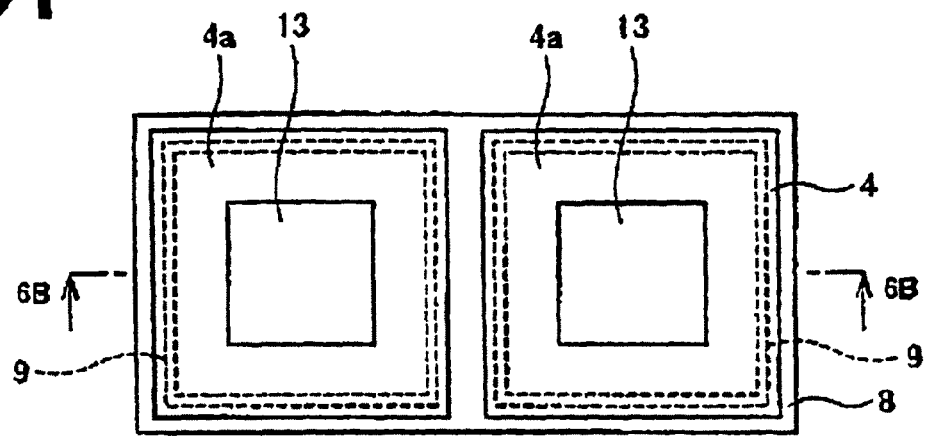
FIG. 6A is a top view schematically showing a process of a method of manufacturing a semiconductor light emitting element according to Example 1 of the invention.
Figure 6B:
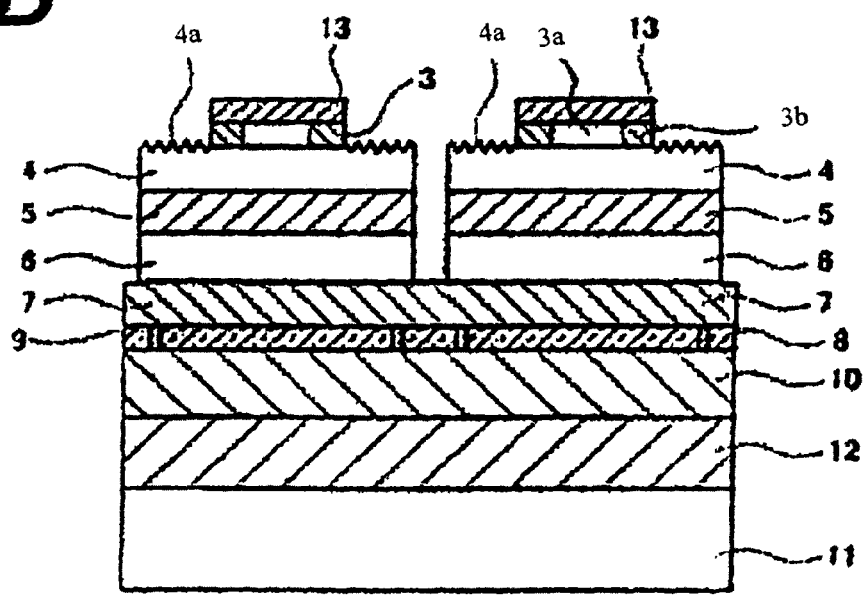
FIG. 6B is a cross-sectional view taken along the line 6B-6B in FIG. 2A.

As shown in FIGS. 5A, 5B, a mask pattern of a quadrangular ring shape was formed on a surface of the n-type GaAs contact layer 3 by using the photolithography method. The mask pattern is formed in a region in which the front surface side contact part 3b is to be formed. Due to this, the mask pattern can be formed in each element region that is a region in which the light emitting element is to be formed.

Next, an etching process was applied to the n-type contact layer by using the mask pattern as a mask and by using a mixed liquid of sulfuric acid, hydrogen peroxide solution and water as an etchant. Due to this, the n-type contact layer located in a region where the mask pattern was not formed was removed, so that only the n-type contact layer located in a region where the n-type contact layer becomes the front surface side contact part remains and simultaneously an n-type $(Al_{0.7}Ga_{0.3})_{0.5}In_{0.5}P$ clad layer 4 was exposed.

Subsequently, a transparent material film to be a transparent dielectric reflection part 3a was formed on a surface of the wafer in which the n-type contact part remaining in a quadrangular ring shape was formed. Particularly, a $SiO_2$ film was formed by the CVD method so as to have a sufficient thickness to cover the n-type contact part remaining in a quadrangular ring shape formed on a surface of the wafer. After that, a mask pattern was formed in a region where the transparent material film is to be left by using the photolithography method. The mask pattern was formed so as to allow the transparent material film to be left, the transparent material film being located on the inside of the n-type contact part (the front surface side contact part 3b) remaining in a quadrangular ring shape for becoming the transparent dielectric reflection part 3a. Then, after conducting the patterning by photolithography, a front surface electrode 13 was formed by deposition on the transparent material film (or the transparent dielectric reflection part 3a) and the n-type GaAs contact layer 3.

Next, as shown in FIG. 6, the surface of wafer was roughened. Particularly, a patterning in cycles of 1.0 μm to 3.0 μm was carried out on an n-type $(Al_{0.7}Ga_{0.3})_{0.5}In_{0.5}P$ clad layer 4 to be a light extraction surface 4a by using the photolithography method, and a concavo-convex shape was formed on a surface of the n-type $(Al_{0.7}Ga_{0.3})_{0.5}In_{0.5}P$ clad layer 4 by a wet etching method.

In addition, a patterning for separating the elements from each other was carried out by using the photolithography technique, and a portion from the surface of n-type clad layer 4 to a p-type clad layer 6 was removed by the wet etching method, so that the separation of the elements from each other was carried out. To lower layers than the p-type contact layer, a dicing process described below is applied so that the separation of the elements from each other is carried out.

After a rear surface electrode 14 formed of a Ti (titanium) layer and a Au (gold) layer on a rear surface of the Si substrate 11 by the vacuum deposition method, an alloy process for alloying the electrodes was carried out by heat-treating at 400 degrees C. for 5 minutes in a nitrogen atmosphere.

In addition, a surface electrode pad 15 formed of a Ti (titanium) layer and a Au (gold) layer for a wire bonding was formed on the front surface electrode 13 by the photolithography technique and the vacuum deposition method.

After that, as shown in FIG. 7, the substrate for LED configured as described above on which the electrodes were formed was cut by using a dicing device, so that a LED bare chip having a chip size of 300 μm square was manufactured.

In addition, the LED bare chip was mounted (die-bonding was carried out) on a TO-18 stem, and then the die-bonding was further carried out to the LED bare chip mounted, so that a LED element was manufactured.

Comparative Example 1

Figure 13:
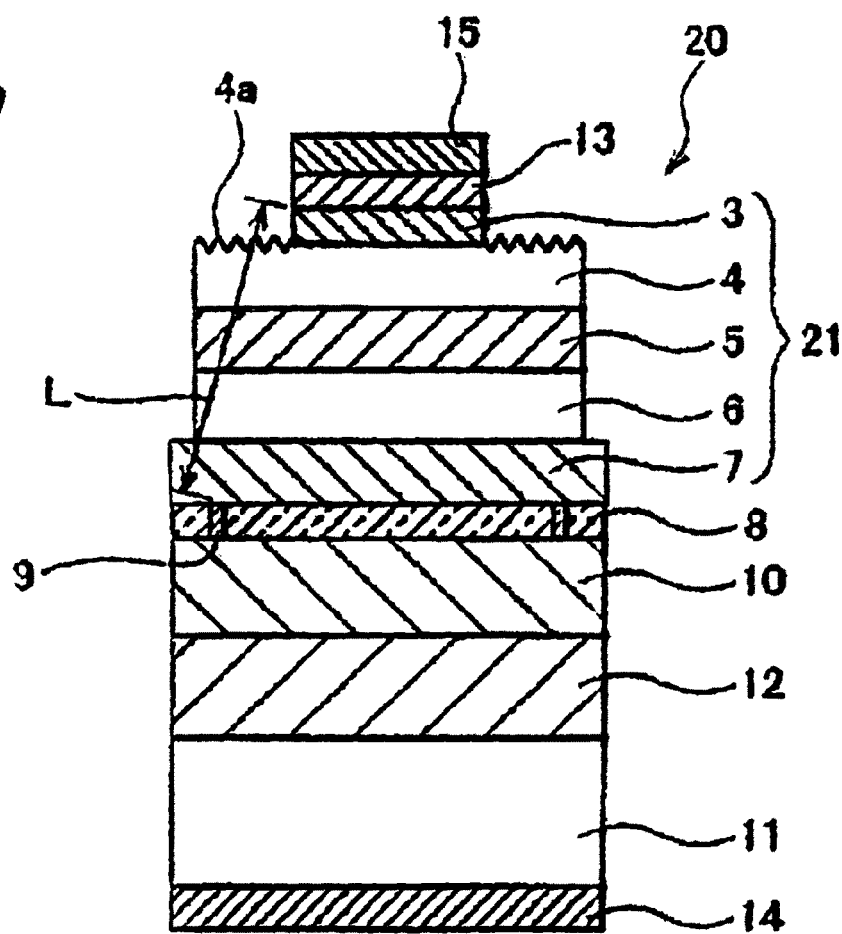
FIG. 13 is a cross-sectional view schematically showing a semiconductor light emitting element of Comparative Example 1.
Figure 14:
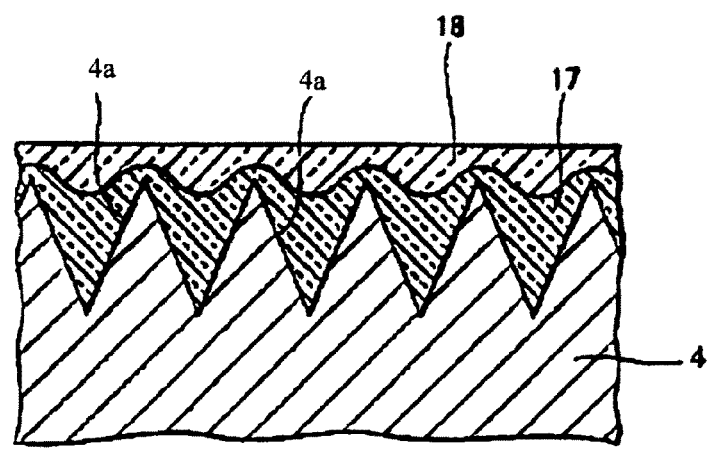
FIG. 14 is a partial enlarged cross-sectional view schematically showing a light extraction surface in a semiconductor light emitting element of a variation.

As a replacing type red light emitting element having a structure shown in FIG. 13 and having a light emitting wavelength at or near 630 nm was manufactured. In Comparative Example 1, the same process and method of manufacturing a LED element as Example 1, such as a method of epitaxial growth, a film thickness of epitaxial layer, a structure of epitaxial layer, a reflection metal film, a method of replacing a support substrate, and an etching method were basically used. Comparative Example 1 is different from Example 1 in a configuration that Comparative Example 1 does not have the transparent dielectric reflection part in the front surface electrode.

After the LED element of Example manufactured as described above was molded with epoxy resin, a current of 20 mA was applied so as to investigate LED characteristics.

In Comparative Example 1, the light output was 11.3 mW and the forward voltage (Vf) was 2.10 V, in contrast, in Example, the light output was 13.2 mW and the forward voltage (Vf) was 2.13 V, and the light output was enhanced by forming the transparent dielectric reflection part in a part between the group III-V compound semiconductor layer and the front surface electrode.

Figure 12:
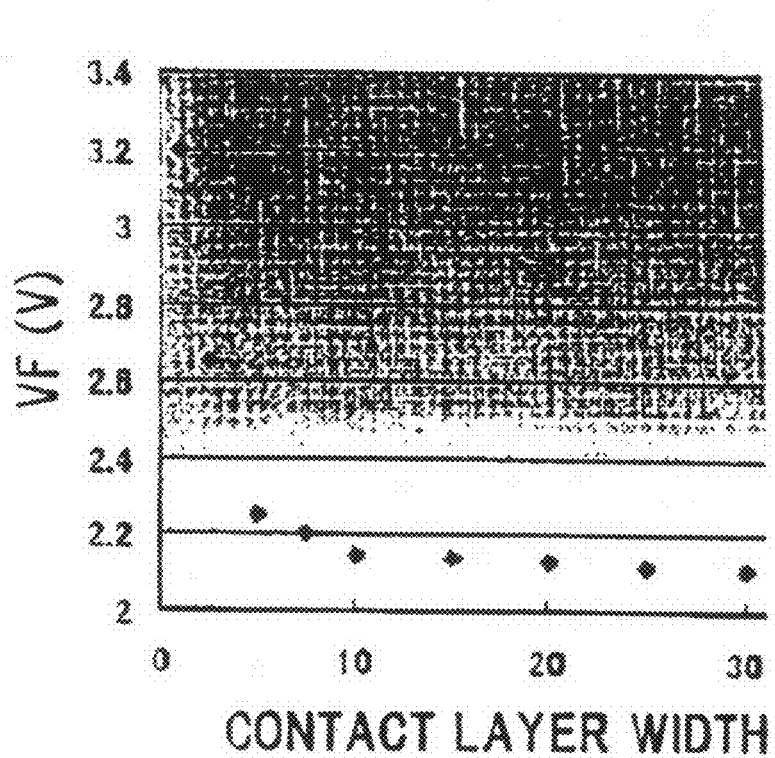
FIG. 12 is a graph schematically showing a relationship between a width of a front surface side contact part and a forward voltage in a structure of Example 1.

In addition, FIGS. 11 to 12 show a result of investigation about relationships between a width of the front surface side contact part, and the light output and the forward voltage, the front surface side contact part being formed of the n-type contact layer and having a quadrangular ring shape. If the width of the front surface side contact part 3b becomes narrow, the light absorption is reduced and the light output is increased. Also, if the width of the front surface side contact part 3b becomes narrow, a current path becomes narrow and resistance is exponentially increased.

Modifications

A light emitting element of a modification has a structure that the light extraction surface 4a formed in the concave-convex shape in the light emitting element of Example 1 is covered with transparent films 17, 18.

First, coating is repeatedly applied to the light extraction surface 4a of the concave-convex shape, so that the concave portion was filled and the transparent film 17 having a surface of a corrugated shape corresponding to the concave-convex shape of the light extraction surface 4a was formed. In addition, the transparent film 18 having a flat surface was formed on the transparent film 17 by sputtering. The transparent film 18 is formed by sputtering, so that the transparent film 18 can be formed so as to have a good crystallinity, and it can be prevented that water or the like infiltrates from the outside therein. Furthermore, in the present invention, the front surface electrode 13 has a simple quadrangular or round shape, so that the coating and sputtering process for forming the transparent films 17, 18 can be easily carried out.

The light extraction surface 4a of the concave-convex shape is covered with the transparent films 17, 18, so that the concave-convex portion of the light extraction surface 4a can be protected. Also, the transparent film 17 is configured to have a refractive index lower than the refractive index (about 3.5 to 3.6) of the semiconductor layer 4 having the light extraction surface 4a, so that reflection at the light extraction surface 4a can be prevented. In addition, it is preferable that the transparent film 18 is configured to have a refractive index lower than that of the transparent film 17, and due to this, reflection at an interface between the transparent film 17 and the transparent film 18 can be prevented. Furthermore, the surface of transparent film 17 is configured to have a corrugated curved surface, so that enhancement of light extraction due to a lens effect can be expected.

For the transparent films 17, 18, any of a conductive material and an insulating material can be used. Particularly, it includes ITO, $SiO_2$, and $Si_3N_4$. Also, for example, it can be adopted that the transparent film 17 located in a side of the semiconductor layer 4 is formed of a conductive material and the transparent film 18 located in a side of the surface is formed of an insulating material. In addition, it can be also adopted that the transparent film 18 is omitted and only the transparent film 17 is formed. Further, materials and manufacturing methods used for the transparent films 17, 18, order of forming the transparent films 17, 18 in the manufacturing process of the light emitting element and the like can be appropriately determined in view of characteristics, productivity, cost and the like of the light emitting element.

Other Examples

In the above-mentioned Example, the Si substrate 11 as the support substrate was used, but not limited to this, the other support substrate can be also used, if it can withstand the manufacturing process of the light emitting element. Particularly, it includes a Ge substrate, a GaAs substrate, a GaP substrate, and an other metal substrate.

In addition, in the above-mentioned Example, as the active layer (the light emitting layer) 5, a bulk layer was used, but not limited to this, multiple quantum well or the like can exhibit a similar effect, and further in the above-mentioned Example, a red light emitting element having a light emitting wavelength at or near 630 nm was described, but the present invention can provide an effect that the light output is enhanced independently of the light emitting wavelength of LED.

Also, in the above-mentioned Example, the n-type doping layer is located in a side of the light extraction surface 4a, but not limited to this, even if the n-type layer and the p-type layer are reversed, an similar effect can be surely obtained.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor light emitting element, comprising:
  a group III-V compound semiconductor layer comprising a light emitting layer, a first main surface comprising a light extraction surface formed thereon, and a second main surface;
  a reflection metal film formed on the second main surface for reflecting a light emitted from the light emitting layer toward the light extraction surface;

a support substrate joined to the group III-V compound semiconductor layer via the reflection metal film;

a front surface electrode formed on the first main surface;

an ohmic contact joint part formed between the reflection metal film and the group III-V compound semiconductor layer except a region directly under the front surface electrode; and a front surface side contact part and a transparent dielectric reflection part formed between the group III-V compound semiconductor layer and the front surface electrode, wherein the semiconductor light emitting element further comprises a quadrangular shape of not more than 320 µm on a side, wherein the front surface electrode comprises a polygonal shape or a circular shape and an outer peripheral length of not less than 235 µm and not more than 700 µm, and wherein the ohmic contact joint part is disposed in a side of an outer peripheral part of the semiconductor light emitting element, formed so as to surround the front surface electrode when the ohmic contact joint part is viewed from a side of the front surface electrode, and disposed so that distance from each location of outer edge parts of the front surface electrode to the ohmic contact joint part nearest to the each location becomes equal to each other.

2. The semiconductor light emitting element according to claim 1, further comprising:

a transparent dielectric film formed between the group III-V compound semiconductor layer and the reflection metal film, wherein the ohmic contact joint part is formed in a part of the transparent dielectric film so as to pass through the transparent dielectric film.

3. The semiconductor light emitting element according to claim 1, wherein the front surface side contact part is formed in a region whose outer peripheral length is not less than 5 µm and not more than 30 µm, and the transparent dielectric reflection part is formed inside the front surface side contact part.

4. The semiconductor light emitting element according to claim 1, wherein the transparent dielectric reflection part comprises $SiO_2$, SiN or ITO.

5. The semiconductor light emitting element according to claim 1, wherein the transparent dielectric reflection part has a refractive index of not more than 2.3.

6. The semiconductor light emitting element according to claim 1, wherein the light extraction surface comprises a concavo-convex shape of not less than 100 nm in height.

7. The semiconductor light emitting element according to claim 1, wherein the ohmic contact joint part comprises a strip portion that is shaped similarly to the polygonal shape or the round shape of the front surface electrode, and is arranged concentrically with the front surface electrode in top view.

8. The semiconductor light emitting element according to claim 6, wherein the light extraction surface is covered with a transparent film.

* * * * *